United States Patent [19]

Flint et al.

[11] 4,293,635

[45] Oct. 6, 1981

[54] PHOTOPOLYMERIZABLE COMPOSITION WITH POLYMERIC BINDER

[75] Inventors: William L. Flint, Somerset; Yvan P. Pilette, Lawrenceville, both of N.J.

[73] Assignee: E. I. Du Pont de Nemours and Company, Wilmington, Del.

[21] Appl. No.: 153,639

[22] Filed: May 27, 1980

[51] Int. Cl.³ .......................... G03C 1/78; G03C 1/68
[52] U.S. Cl. .................... 430/271; 430/281; 430/283; 430/288; 430/905; 430/906; 430/910; 204/159.15; 204/159.16
[58] Field of Search .............. 430/281, 906, 910, 905, 430/271, 288, 283; 204/159.15, 159.16

[56] References Cited

U.S. PATENT DOCUMENTS

| | | | |
|---|---|---|---|
| 3,458,311 | 7/1969 | Alles | 430/273 |
| 3,459,632 | 8/1969 | Caldwell et al. | 162/175 |
| 3,469,982 | 9/1969 | Celeste | 430/324 |
| 3,647,763 | 7/1972 | Stockmann et al. | 360/78 SC |
| 3,748,221 | 7/1973 | Stockmann et al. | 162/164 |
| 3,833,384 | 9/1974 | Noonan et al. | 430/910 |
| 3,867,153 | 2/1975 | Maclachlan | 430/9 |
| 3,927,199 | 12/1975 | Micchelli et al. | 424/47 |
| 3,930,865 | 1/1976 | Faust et al. | 430/910 |
| 4,097,417 | 6/1978 | Postor et al. | 252/501 |

OTHER PUBLICATIONS

Amphomer ®, Publication No. 14874, National Starch and Chemical Corporation.

Primary Examiner—Jack P. Brammer

[57] ABSTRACT

A photosensitive composition having reduced cold flow comprising (a) addition polymerizable ethylenically unsaturated monomer, (b) an initiating system activatable by actinic radiation, and (c) an organic polymeric binder containing at least two percent by weight, basis binder, of an amphoteric interpolymer.

13 Claims, 1 Drawing Figure

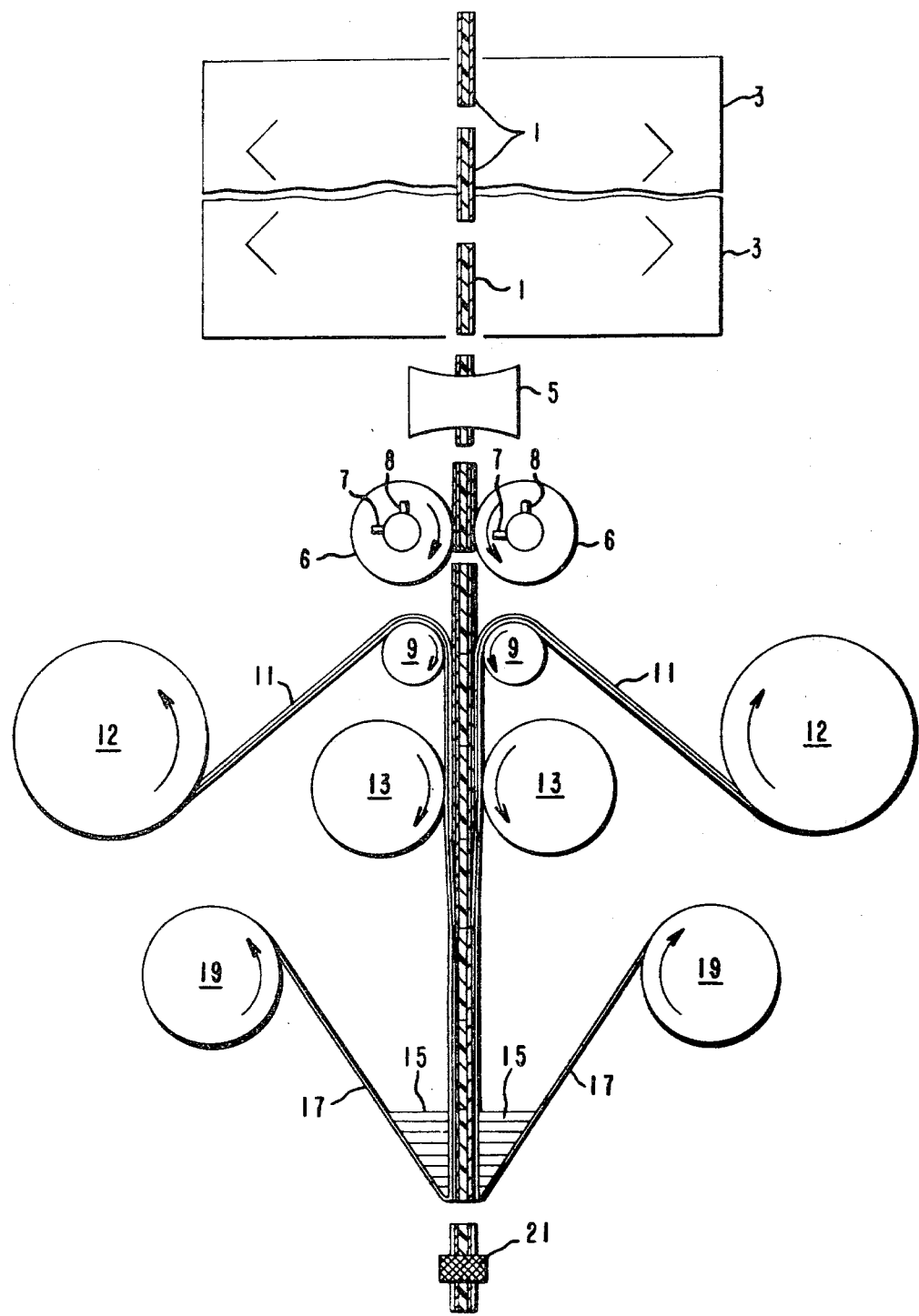

4,293,635

PHOTOPOLYMERIZABLE COMPOSITION WITH POLYMERIC BINDER

TECHNICAL FIELD

The invention relates to photopolymerizable compositions and particularly those having improved resistance to cold flow.

BACKGROUND OF THE INVENTION

Photopolymerizable compositions have for several years been supplied commercially in layer form sandwiched between a support film and a cover sheet for use as a photoresist in the manner described in U.S. Pat. No. 3,469,982. This photoresist element has been supplied in roll form to users of the photoresist such as printed circuit manufacturers. The cover sheet prevents the photopolymerizable layer from sticking to the backside of the support film under the interlayer pressure normally present in the roll, thus enabling the element to be unrolled for photoresist use.

Cold flow of the layer has frequently been a problem, however. By cold flow is meant flow of the layer at ambient temperature conditions. The photopolymerizable layer has some tendency, depending on composition and layer thickness, to flow out the ends of the roll during storage. In extreme cases, adjacent layers come together at the roll ends and bond together to prevent unrolling of the layers.

U.S. Pat. No. 3,867,153 discloses photopolymerizing the ends of the photopolymerizable layers in the roll, which prevents cold flow of the layers out from the end of the roll. While this technique is successful, it necessarily involves a further manipulative step and thus higher cost of the product.

It is also desirable to omit the cover sheet from the photoresist element since this too would be a saving in manufacturing cost. Without the cover sheet, however, the photopolymerizable layer can flow into intimate contact with the backside of the support film, thereby tending to adhere to it and prevent unrolling of the roll.

It is, of course, recognized in the prior art that simply by reducing level of monomer/plasticizer or by using a higher molecular weight binder, a photopolymerizable layer having reduced cold flow can be obtained. However, this approach results in slower photopolymerization and washout (development) rates. Thus, there remains a definite need for a really satisfactory solution to the problem of cold flow.

Brief Description of the Invention

The invention is primarily directed to a novel photosensitive composition having reduced cold flow comprising (a) addition polymerizable ethylenically unsaturated monomer; (b) an initiating system activatable by actinic radiation; and (c) an organic polymeric binder containing at least two percent by weight, basis binder, or an amphoteric polymer which is an interpolymer of (1) 30–60 percent by weight of a comonomer selected from the group consisting of $C_{2-12}$ N-alkyl acrylamide and methacrylamide, $C_{1-4}$ alkyl ($C_{2-4}$) aminoalkyl acrylates and methacrylates, and mixtures thereof; (2) 12–18 percent by weight of an acidic comonomer selected from the group consisting of acrylic, methacrylic, crotonic, itaconic, maleic and fumaric acids and $C_{1-4}$ alkyl half esters of maleic and fumaric acid, and mixtures thereof; and (3) 20–55 percent of a copolymerizable comonomer selected from the group consisting of $C_1$–$C_{12}$ alkyl acrylates, $C_1$–$C_{12}$ alkyl methacrylates, $C_{2-4}$ hydroxyalkyl acrylates, hydroxystearyl acrylate, $C_{2-4}$ hydroxyalkyl methacrylates, hydroxystearyl methacrylates, and mixtures thereof.

The above-described photosensitive composition exhibits not only reduced cold flow but good photopolymerization and washout rates as well.

In a further aspect the invention is directed to photoresist film element comprising a layer of the above-described photosensitive composition coated upon a film support. In a still further aspect, the invention is directed to roll comprising a long web of the supported photosensitive layer rolled upon itself with the support outermost.

BRIEF DESCRIPTION OF THE FIGURE

Further advantages and details of the invention will be apparent by reference to the FIGURE which consists of a single figure which illustrates schematically a preferred method of using the photosensitive compositions of the invention in a continuous laminating process.

DETAILED DESCRIPTION OF THE INVENTION

The amphoteric polymers which are necessary components of the binder of the photosensitive compositions of the invention are interpolymers derived from the interpolymerization of (1) at least one basic comonomer which is an acrylic or methacrylic acrylamide or methacrylamide, an aminoalkyl acrylate or methacrylate or mixture of any of these; (2) at least one acidic comonomer containing one or more carboxyl groups and (3) at least one further comonomer which is acrylic or methacrylic in character.

The applicable N-substituted acrylamides or methacrylamides are substituted with alkyl radicals containing from 2–12 carbon atoms. Among the applicable acrylamides and methacrylamides are included N-ethyl acrylamide, N-tertiary-butyl acrylamide, N-n-octyl acrylamide, N-tertiary-octyl acrylamide, N-decyl acrylamide, N-dodecyl acrylamide, as well as the corresponding methacrylamides. Suitable aminoalkyl compounds are the $C_{1-4}$ alkyl ($C_{2-4}$) aminoalkyl acrylates and methacrylates.

Suitable acidic comonomers for the amphoteric polymers used in the invention are those having at least one available carboxylic acid group. These include acrylic acid, methacrylic acid, crotonic acid, itaconic acid, maleic acid, fumaric acid and the $C_1$–$C_4$ alkyl half esters of maleic and fumaric acids such for example, as methyl hydrogen maleate and butyl hydrogen fumarate as well as any other acidic monomers which are capable of being copolymerized with the particular interpolymer system whose use is desired by the practitioner. As is known to those skilled in the art, the acidic comonomer(s) must be so chosen as to be readily polymerizable with the selected interpolymer system.

In order to modify or enhance certain properties of the amphoteric polymer, such as adhesion, compatibility, water solubility, hardness, flexibility, antistatic properties and the like, any of the following acrylic and methacrylic comonomers can be used: acrylic and methacrylic acid esters of aliphatic alcohols having from 1 to 12 carbon atoms such as methyl, ethyl, propyl, butyl, octyl and lauryl alcohols; hydroxyalkyl esters of acrylic and methacrylic acids such as hydroxypropyl acrylate and methacrylate, hydroxybutyl acrylate and methacrylate, hydroxystearyl acrylate and methacrylate and hydroxyethyl acrylate and methacrylate; alkyl ($C_1$-$C_4$) amino alkyl ($C_2$-$C_4$) esters of acrylic and methacrylic acids such as N,N'-diethylaminoethyl acrylate, N-tert.-butylaminopropyl acrylate, N,N'-dimethylaminoethyl methacrylate, N-tert.-butylaminoethyl methacrylate and the quaternization product of dimethylaminoethyl methacrylate and dimethyl sulfate, diethyl sulfate and the like; diacetone acrylamide; vinyl esters such as vinyl acetate and vinyl propionate; and styrene monomers such as styrene and alpha-methyl styrene.

Preferred amphoteric interpolymers are those containing from about 30–60% of the N-substituted acrylamide or methacrylamide, from 10–20%, (and 12–18%, preferably) of the acidic comonomer, and up to 55% of at least one copolymerizable comonomer; these percentages being based on the total weight of the interpolymer. The percentages given herein and in the claims are to be taken so that the comonomers of the interpolymer will total to 100%.

Particularly preferred because they combine the best combination of physical properties for the invention are those polymers containing from 35–45% of N-tert.-octyl acrylamide, from 12–18% of acrylic or methacrylic acid, from 32–38% of methyl methacrylate, from 2–10% of hydroxypropyl acrylate, and from 2–10% of an alkyl ($C_1$-$C_4$) amino alkyl ($C_2$-$C_4$) acrylate or methacrylate.

Preparation of the above-described acrylic interpolymers is described in U.S. Pat. No. 3,927,199 to Micchelli et al.

The above-described amphototeric polymers of this invention, when used in combination with typical monomers used in photoresist films, are compatible with these photosensitive monomers giving clear, photoactive films that develop rapidly, yet are nontacky, nonblocking and nonedgefusing. Although the exact mechanism is not fully known, it appears that these amphoteric polymers withstand the plasticizing action of these monomers, which usually contain ester groupings, much more effectively than do the typical ester, acrylate or methacrylate polymers or acid-containing copolymers thereof. Consequently, they appear to form a firm skeletal structure within the photoresist matrix which is responsible for nontacky, nonblocking characteristics and reduced cold flow.

In general, photopolymer films used as film resists are comprised of thermoplastic polymers highly plasticized with photosensitive monomers. Such highly plasticized compositions tend to adhere better to substrates, have higher photospeed and faster washout rates on development than less plasticized compositions. They also are usually tacky and have considerable cold flow. This results in blocking or sticking to the backside of their support when they are wound in rolls without a cover film or antistick backing. They also stick to the exposure mask if the support film carrying the photoresist layer is removed prior to exposure. Furthermore, when thicker resist films are tightly wound in rolls, the photopolymer oozes out at the edges and fuses the laps of the roll so that it cannot be unwound.

Suitable cobinders which can be used as the combination with the amphoteric polymer include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; and polyformaldehydes.

The cobinder preferably contains sufficient acidic or other groups to render the composition even more processible in aqueous developer. Useful aqueous-processible binders include those disclosed in U.S. Pat. No. 3,458,311 and in U.K. Pat. No. 1,507,704.

The amount of amphoteric polymer vis-a-vis the other binder constituent is largely a function of the properties desired. It has been found that at least about 2% wt. amphoteric polymer, basis binder, is needed to render the photosensitive layer nontacky and to evidence cold flow reduction. However, at least about 5% wt. amphoteric polymer is preferred and still higher amounts can also be used advantageously. Amount of amphoteric polymer up to 100% of the polymeric binder may be used with still further improvements in reduced cold flow. It will be recognized by those skilled in the art that the precise amount needed in a given system to obtain a reduced level of tackiness and/or cold flow will also depend, inter alia, on the ratio of plasticizing components to the binder.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropanediacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-dydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the photohardenable layer can also contain at least one free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbon atoms or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such herteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoiniators and photoinhibitors are sensitizers disclosed in U.S. Pat. No. 4,162,162.

The composition of the invention preferably also contains an inhibitor to prevent thermal polymerization of the photopolymerizable system.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may also be added to increase the visibility of the resist image. Any colorant used, however, should preferably be transparent to the actinic radiation used, although they may be opaque or strongly absorb other radiation in the visible or U.S. spectral region.

The photosensitive compositions of the invention will most frequently be employed as the photosensitive layer of a resist element in which the photosensitive layer is coated upon a support film.

In conventional photoresist elements it is necessary or at least highly desirable to protect the photosensitive layer by a removable cover sheet in order to prevent blocking between the photosensitive layer and the reverse surface of the support when they are stored in roll form. It is also desirable to protect the layer laminated to a substrate by means of the removable support film during imaging exposure to prevent blocking between the layer and the phototod. A very important advantage of the amphoteric interpolymer containing photosensitive compositions of the invention is that the blocking tendency of the layer is sufficiently low that a cover sheet or support film need not be used. Thus because the photolayer also has low cold flow photoresist elements made from the photosensitive compositions of the invention need not have a cover sheet. It will, however, be recognized that a cover sheet may, nevertheless, be used if it is desired to do so. Similarly, such compositions need not have a support film during imaging exposure, which allows preparation of higher resolution resist images.

The photopolymerizable composition is coated upon the support at a dry coating thickness of about 0.0003 inch (~0.0008 cm) to about 0.01 inch (~0.025 cm) or more. A suitable strippable support which preferably has a high degree of dimensional stability to temperature changes, may be chosen from a wide variety of films composed of high polymers, e.g., polyamides, polyolefins, polyesters, vinyl polymers, and cellulose esters, and may have a thickness of from 0.00025 inch (~0.0006 cm) to 0.008 inch (~0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film having a thickness of about 0.001 inch (~0.0025 cm).

When an element contains no removable, protective cover sheet and is to be stored in roll form, the reverse side of the strippable support preferably has applied thereto a thin release layer of a material, such as wax or silicone, to prevent blocking with the photopolymerizable stratum. Alternatively, adhesion to the coated photopolymerizable layer may be preferentially increased by flame treating or electrical discharge treating the support surface to be coated.

Suitable removable, protective cover sheets when used may be chosen from the same group of high polymer films described above and may have the same wide range of thicknesses. A cover sheet of 0.001 inch (~0.0025 cm) thick polyethylene is especially suitable. Supports and cover sheets as described above provide good protection to the photopolymerizable resist layer during storage prior to use.

In practicing the invention, photosensitive film resist elements of various type may be used. In general photohardenable, negative-working elements are photopolymerizable elements of the type disclosed in U.S. Pat. No. 3,469,982 and the photocrosslinkable elements of the type disclosed in U.S. Pat. No. 3,526,504. Positive-working, resist elements may be of the photosolubilizable type or of the photodesensitizable type, such as the nitroaromatic compositions of U.K. Pat. No. 1,547,548.

The photosensitive composition of the invention may be used advantageously in a broad spectrum of photosensitive applications, e.g., the preparation of dot-etchable litho masks as shown in U.S. Pat. No. 4,173,673. The compositions are particularly useful as the photosensitive layer of resist elements which are to be used for making printed circuit boards. They are also quite useful for the preparation of lithographic printing plates.

In many of the applications in which the composition of the invention will be used, it will be laminated to a substrate after which the support layer is removed. Generally, suitable substrates for use of the invention in printed circuit formation are those which have mechanical strength, chemical resistance and good dielectric properties. Thus, most board materials for printed circuits are thermosetting or thermoplastic resins usually combined with a reinforcing agent. Thermosetting resins with reinforcing fillers are ordinarily used for rigid boards, whereas thermoplastic resin without reinforcements are usually used for flexible circuit boards.

Typical board construction involves combinations such as phenolic or epoxy resins on paper or a paper-glass composite, as well as polyester, epoxy, polyimide, polytetrafluorethylene, or polystyrene on glass. In most instances, the board is clad with a thin layer of electroconductive metal of which copper is by far the most common.

Suitable substrates for the process of the invention involving preparation of lithographic printing plates are those which have mechanical strength and surfaces which differ in hydrophilicity or oleophilicity from the surfaces of the imaged photosensitive areas laminated thereto. Such elements are disclosed in U.S. Pat. No. 4,072,528. While numerous substrates are satisfactory for this purpose, thin anodized aluminum plates, such as disclosed in U.S. Pat. No. 3,458,311 are particularly useful.

It is essential that the printed circuit substrates used in the process of the invention be clean and free of any extraneous material which might render any significant amount of the surface nonwettable. For this reason, it will frequently be desired to clean printed circuit substrates prior to lamination by one or more of the several cleaning processes which are well-known in the field of printed circuit board manufacture. The particular type of cleaning depends upon the type of contamination—organic, particulate or metallic. Such methods include degreasing with solvents and solvent emulsions, mechanical scrubbing, alkaline soaks, acidification and the like, followed by rinsing and drying.

Suitable cleanliness can be very easily determined by dipping the substrate into water, removing it from the water and observing the board surface. If a uniform film of water is observed, the board is adequately clean but if a discontinuous streaked film or large droplets are formed, the board is not sufficiently clean to be used in the process of the invention.

A preferred method for laminating the photosensitive layer of the invention is disclosed in copending U.S. patent applications, Ser. Nos. 153,634, 153,638, and 153,637, filed concurrently herewith.

The invention will be more clearly understood by reference to the following examples:

EXAMPLE I

Preparation of Negative Photoresist

A roll of photoresist film having no cover sheet is prepared as follows:

A photosensitive coating solution is prepared having the following composition:

|  | Component | Parts by Weight |
|---|---|---|
| (a) | 1:1 Copolymer of styrene and maleic anhydride partially esterified with isobutyl alcohol; mol. wt. ca. 20,000; acid number ca. 180 | 40 |
| (b) | Terpolymer of 17% ethyl acrylate, 71% methyl methacrylate, and 12% acrylic acid; mol. wt. ca. 300,000; acid number ca. 105 | 12.6 |
| (c) | Amphateric Interpolymer formed from 40% N-tert.-octyl acrylamide, 34% methyl methacrylate, 16% acrylic acid, 6% hydroxy propyl methacrylate, and 4% t-butyl amino ethyl methacrylate; mol. wt. ca. 50,000 | 5 |
| (d) | Polyoxyethylated trimethylolpropane triacrylate (20 moles of ethylene oxide) (M.W. 1162) | 10 |
| (e) | Trimethylolpropane triacrylate | 12.5 |
| (f) | Benzophenone | 4 |
| (g) | 4,4'-Bis(dimethylamino) benzophenone (Michler's ketone) | 0.7 |
| (h) | 2,2'-Bis(2-chlorophenyl)-4,4',5,5'-tetraphenyl biimidazole | 3 |
| (i) | Leuco crystal violet | 0.4 |
| (j) | Benzotriazole | 0.2 |
| (k) | 1,4,4-Trimethyl-2,3-diazobicyclo-[3.2.2]-non-2-ene-2,3-dioxide | 0.06 |
| (l) | Victoria Green (C.I. Pigment Green 18) | 0.03 |
| (m) | Methylene chloride | 200 |
| (n) | Methanol | 15 |

Into the above coating solution are dispersed 13 parts by weight of polyethylene beads of which 85% have diameters below 10$\mu$ and 15% have diameters between 10 and 20μ. The mixture is coated on a 0.00127 cm thick poly(ethylene terephthalate) film which has coated on its reverse side a thin layer of a mixture of Carnuba wax and poly(vinylidene chloride). The photosensitive layer is dried to give a dry thickness of 0.00254 cm and about 30.5 meters of the dried coated element is wound into a roll.

The photosensitive layer of the rolled element was then laminated to one side of a cleaned copper-clad boards and trimmed in the manner described in Example I of copending U.S. patent application Ser. No. 153,634, filed concurrently herewith. The laminated and trimmed boards could then be conventionally imaged and processed to form printed circuits.

EXAMPLE II

A photosensitive composition containing an amphoteric interpolymer as the sole binder component was prepared by admixing the following ingredients:

| | Component | Grams |
|---|---|---|
| (a) | Amphoteric interpolymer formed from 40% N-tert.-octylacrylamide, 34% methyl methacrylate, 16% acrylic acid, 6% hydroxypropyl methacrylate, and 4% t-butyl amino ethyl methacrylate | 54 |
| (b) | Trimethylolpropane triacrylate | 28 |
| (c) | benzophenone | 4 |
| (d) | Michler's ketone | 0.6 |
| (e) | CI-109 Red Dye | 0.1 |
| (f) | Polyethylene beads of Example I | 13 |
| (g) | Methylene chloride | 215 |
| (h) | Methanol | 25 |

The above coating composition was coated onto a 0.00127 cm thick poly(ethylene terephthalate) film and dried to form a photopolymerizable layer having a dry thickness of 0.00254 cm.

A sample of the coated photopolymerizable layer was conventionally laminated with heat and pressure to one side of a cleaned copper-clad substrate board. The cleaned copper surface was wet with a 30% ethanol water solution just before lamination. The polyester support film was first removed from the laminated element and the photopolymerizable layer was imaged using a 1000 watt Colight® DMVL-HP for 30 sec. through a circuit-patterned photomask. The exposed resist was developed in 30–40 seconds to yield a printed resist image using 1% $Na_2CO_3$ water solution at 29.5° C. The resulting photoresist was used to pattern plate a tin/lead alloy electrolytically. Excellent results were obtained in that smooth plated lines were obtained with no indication of resist lifting or underplating and 0.005 cm thick lines separated by 0.005 cm spaces were cleanly resolved. The resist was stripped in 15 seconds at 65.5° C. in a 1.5% KOH water solution. The resulting unplated copper areas of the element could be conventionally etched in ferric chloride etchant solution to produce a high quality printed circuit.

EXAMPLE III

The effect of amphoteric interpolymer concentration on reducing cold flow or creep is measured as a function of creep viscosity, i.e., the viscosity associated with creep as defined in Chapter 3 of *Mechanical Properties of Polymers* by Lawrence E. Nielson (Reinhold Publishing Corp., NY, 1962).

Using different concentrations of interpolymers and corresponding different concentration of acid copolymer, a series of three photosensitive compositions was prepared and identified as compositions A, B and C.

| | | Composition | | |
|---|---|---|---|---|
| | | A | B | C |
| | Component | Parts by Weight | | |
| (a) | Interpolymer formed from 40% N-tert.-octyl acrylamide, 34% methyl methacrylate, 16% acrylic acid, 6% hydroxy propyl methacrylate, and 4% t-butyl amino ethyl methacrylate; mol. wt. ca. 50,000 | 0 | 20 | 51 |
| (b) | 1:1 Copolymer of styrene and maleic anhydride partially esterified with isobutyl alcohol; mol. wt. ca. 20,000; acid number ca. 180 | 51 | 31 | 0 |

The concentrations of the following components of the compositions were maintained constant for each composition:

| | Component | Concentration Parts by Weight |
|---|---|---|
| (c) | Terpolymer of 17% ethyl acrylate, 71% methyl methacrylate, and 12% acrylic acid; mol. wt. ca. 300,000; acid number ca. 105 | 5 |
| (d) | Polyoxyethylated trimethylolpropane triacrylate (20 moles of ethylene oxide) (M.W. 1162) | 12 |
| (e) | Trimethylolpropane triacrylate | 12 |
| (f) | Benzophenone | 3 |
| (g) | (Michler's ketone) | 0.25 |
| (h) | 2,2'-Bis(2-chlorophenyl)-4,4',5,5'-tetraphenyl biimidazole | 3 |
| (i) | Leuco crystal violet | 0.4 |
| (j) | Benzotriazole | 0.2 |
| (k) | 1,4,4-Trimethyl-2,3-diazobicyclo-[3.2.2]-non-2-ene-2,3-dioxide | 0.06 |
| (l) | Victoria Green (C.I. Pigment Green 18) | 0.03 |
| (m) | Polyethylene beads of Example I | 13 |
| (n) | Methylene chloride | 215 |
| (o) | Methanol | 25 |

Each of the three coating compositions was coated on a separate 0.00127 cm thick poly(ethylene terephthalate) web to give a photosensitive layer with a dry thickness of 0.00254 cm.

Using the method of Nielson, "Creep Viscosity" was determined for each of the three dry coatings and are tabulated vs % of total binder wt. of amphoteric interpolymer.

| Composition | % by weight Amphoteric Interpolymer | "Creep Viscosity" ($10^8$ poise) |
|---|---|---|
| A | 0 | 6 |
| B | 36 | 27 |
| C | 91 | 36 |

As "Creep Viscosity" increases, creep or cold flow decreases. Thus the marked increase in creep viscosity with amphoteric interpolymer concentration indicates that the resulting coatings will be less susceptible to cold flow. Hence, it is indicated that amphoteric interpolymer will reduce blocking and edge fusion of rolled coatings.

Two photosensitive coating compositions designated D and E were prepared and coated as in Example I except the compositions contained no polyethylene beads and the component concentrations were as follows:

| | Component | Composition D Parts by Weight | E |
|---|---|---|---|
| (a) | 1:1 Copolymer of styrene and maleic anhydride partially esterified with isobutyl alcohol; mol. wt. ca. 20,000; acid number ca. 180 | 52.7 | 51.7 |
| (b) | Terpolymer of from 17% ethyl acrylate, 71% methyl methacrylate, and 12% acrylic acid; mol. wt. ca. 300,000; acid number ca. 105 | 14 | 10 |
| (c) | Interpolymer formed from 40% N-tert.-octyl acrylamide, 34% methyl methacrylate, 16% acrylic acid, 6% hydroxy propyl methacrylate, and 4% t-butyl amino ethyl methacrylate; mol. wt. ca. 50,000 | — | 5 |
| (d) | Polyoxyethylated trimethylolpropane triacrylate (20 moles of ethylene oxide) (M.W. 1162) | 13.5 | 13.5 |
| (e) | Trimethylolpropane triacrylate | 13.5 | 13.5 |
| (f) | Benzophenone | 3 | 3 |
| (g) | Michler's ketone | 0.5 | 0.5 |
| (h) | 2,2'-Bis(2-chlorophenyl)-4,4',5,5'-tetraphenyl biimidazole | 2 | 2 |
| (i) | Leuco crystal violet | 0.4 | 0.4 |
| (j) | Benzotriazole | 0.24 | 0.24 |
| (k) | 1,4,4-Trimethyl-2,3-diazobicyclo-[3.2.2]-non-2-ene-2,3-dioxide | 0.03 | 0.03 |
| (l) | Victoria Green (C.I. Pigment Green 18) | 0.03 | 0.03 |
| (m) | Methylene chloride | 190 | 190 |
| (n) | Methanol | 13 | 16 |

Each element was wound into a roll and the rolls were placed in and stored horizontally in an oven at 40° C. After 10 days the rolled element containing no amphoteric interpolymer (Composition D), blocked and could not be unrolled. On the other hand, the rolled element containing the amphoteric interpolymer (Composition E) did not block and was easily unrolled. After 4 weeks in the oven, rolled element from Composition E could still be unrolled and used as a photoresist as described in Example I.

EXAMPLE IV

A series of three photosensitive compositions using identical concentrations of three compositionally different amphoteric interpolymers was prepared. The polymers were prepared by the procedure in Example 12 of U.S. Pat. No. 3,927,199 and had the following composition:

| Monomer | % by Weight | | |
|---|---|---|---|
| Methyl methacrylate | 34 | 35 | 31 |
| Acrylic acid | 16 | 25 | 25 |
| Octyl acrylamide | 40 | 40 | 40 |
| t-Butylaminoethyl methacrylate | 4 | — | 4 |
| Hydroxypropyl methacrylate | 6 | — | — |
| | 100 | 100 | 100 |

Each of the above-described amphoteric interpolymers was incorporated into a photosensitive composition having the following proportions:

| | Component | Grams |
|---|---|---|
| (a) | Terpolymer of 17% ethyl acrylate, 71% methyl methacrylate, and 12% acrylic acid; mol. wt. ca. 300,000; and number ca. 105 | 6.7 |
| (b) | Amphoteric interpolymer | 42.0 |
| (c) | Trimethylolpropane triacrylate | 28 |
| (d) | Benzophenone | 6 |
| (e) | Michler's ketone | 0.5 |
| (f) | 2,2'-Bis-(2-chlorophenyl)-4,4',5,5'-tetraphenyl biimidazole | 0.5 |
| (g) | Leuco crystal violet | 0.1 |
| (h) | Benzotriazole | 0.2 |
| (i) | CI-109 Red Dye | 0.2 |
| (j) | Polyethylene beads of Example I | 16 |
| (k) | Methylene chloride | 200 |
| (l) | Methanol | 17 |

Each of the above-described photosensitive compositions was cast onto a 0.00127 cm thick poly(ethylene terephthalate) web and dried to form a photoresist in the manner of Example I. The photosensitive layers were then laminated to one side of cleaned copper-clad substrate boards and trimmed in the manner described in Example I of copending U.S. patent application Ser. No. 153,634, filed concurrently herewith.

Each of the laminated and trimmed boards was imaged by being uniformly exposing for thirty seconds to the visible light of a Colight® DMVL-HP light source. Upon development for 30–40 seconds in an aqueous solution of 1% by weight $Na_2CO_3$ at 29.5° C., each film gave an excellent resist image.

EXAMPLE V

A further photosensitive composition containing no dispersed polyethylene beads was prepared by admixing the following ingredients:

| | | Grams |
|---|---|---|
| (a) | Terpolymer of 17% ethyl acrylate, 71% methyl methacrylte, and 12% acrylic acid; mol. wt. ca. 300,000; | 5 |
| (b) | Amphoteric interpolymer of 40% N-tert.-octyl acrylamide, 34% methyl methacrylate, 16% acrylic acid, 6% hydroxypropyl methacrylate, and 4% t-butyl-aminoethyl methacrylate | 49 |
| (c) | Trimethylolpropane triacrylate | 28 |
| (d) | Benzophenone | 4 |
| (e) | Michler's ketone | 0.6 |
| (f) | CI-109 Red Dye | 0.2 |
| (g) | 1,4,4-Trimethyl-2,3-diazobicyclo-[3.2.2]-non-2-ene-2,3-dioxide | 0.06 |
| (h) | Methylene chloride | 200 |
| (j) | Methanol | 17 |

The mixed ingredients were coated on a polyester support film and dried to a 0.00254 cm thick photosensitive layer. A 0.00254 cm thick protective polyethylene film was applied to the photosensitive layer. The protective cover sheet was removed shortly before the layer was laminated using heat and pressure to a copper plate. The layer was imaged using a 1000 watt Colight® DMVL-HP for 30 sec. through a circuit patterned photomask. The exposed resist was developed for 30–40 seconds to yield a printed circuit image using 1% $Na_2CO_3$ water solution at 29.5° C. The resulting photoresist was used to pattern plate a tin/lead alloy electrolytically with excellent results. The resist was stripped in 15 sec. at 65.5° C. in a 1.5% KOH water solution. The uncovered copper was etched away in a 43 Be° ferric chloride solution to produce a printed circuit.

EXAMPLE VI

Preparation of Positive-Working Photoresist

A positive-working photosensitive composition is prepared by admixing the following ingredients:

| | | Grams |
|---|---|---|
| (a) | Methyl methacrylate/methacrylic acid (92/8) copolymer, medium molecular weight | 44.4 |
| (b) | Interpolymer formed from 40% N-tert.-octyl acrylamide, 34% methyl methacrylate, 16% acrylic acid, 6% hydroxypropyl methacrylate, and 4% t-butyl amino ethyl acrylate; mol. wt. ca. 50,000 | 10.0 |
| (c) | Trimethylolpropane triacrylate | 36 |
| (d) | 2,2'-Bis(2-chlorophenyl)-4,4',5,5'-tetraphenyl biimidazole | 3 |
| (e) | Triethylene glycol diacetate | 1 |
| (f) | Tricresyl phosphate | 3 |
| (g) | 3-[N-ethyl-2,3,4-trihydro-1H-benzo[b]-pyridin-6-yl]methylidyne-2,3-dihydro-4-H-1-benzopyran-4-one | 1 |
| (h) | 4,5-Dimethoxy-2-nitro-1[-1[4(1,1-dimethyl ethyl)phenoxy]ethyl]-benzene | 4 |
| (i) | Benzotriazole | 0.2 |
| (j) | CI-109 Red Dye | 0.3 |
| (k) | Methylene chloride | 150 |
| (l) | Methanol | 11 |

The mixture is coated on a 0.00127 cm thick polyethylene terephthalate web and dried to give a photosensitive layer with a dry thickness of 0.00254 cm.

The photosensitive layer is laminated to one side of cleaned copper-clad substrate boards and self trimmed as in Example I.

Each of the laminated and trimmed boards is imaged by exposing for sixty seconds the photosensitive layer to UV radiation from a Colight® DMVL-HP light source passing through transparent portions of a phototool corresponding to a printed circuit pattern. The phototool is then removed and replaced with a filter which is opaque to UV radiation below 4000 A and the boards are uniformly exposed for sixty seconds to the visible light of the Colight® DMVL-HP light source. The imagewise exposed areas are completely removed by development for only 30–40 seconds in an aqueous solution of 9% ethylene glycol monobutyl ether and 1% sodium borate. The imaged and developed laminate is ready for circuit preparation by conventional plating and etching photoresist techniques.

EXAMPLE VII

Preparation of Lithographic Printing Plate

A photosensitive coating mixture is prepared having the following composition:

| | Component | Parts by Weight |
|---|---|---|
| (a) | Terpolymer of 17% ethyl acrylate, 71% methyl methacrylate, and 12% acrylic acid; mol. wt. ca. 300,000; acid number ca. 105 | 5 |
| (b) | Interpolymer formed from 40% N-tert.-octyl acrylamide, 34% methyl methacrylate, 16% acrylic acid, 6% hydroxy propyl methacrylate, and 4% t-butyl amino ethyl methacrylate; mol. wt. ca. 50,000 | 51 |
| (c) | Polyoxyethylated trimethylolpropane triacrylate (20 moles of ethylene oxide) (M.W. 1162) | 12 |
| (d) | Trimethylolpropane triacrylate | 12 |
| (e) | Benzophenone | 3 |
| (f) | Michler's ketone | 0.25 |
| (g) | Polyethylene beads of Example I | 13 |
| (h) | 2,2'-Bis(2-chlorophenyl)-4,4',5,5'-tetraphenyl biimidazole | 3 |
| (i) | Leuco crystal violet | 0.4 |
| (j) | Benzotriazole | 0.2 |
| (k) | 1,4,4-Trimethyl-2,3-diazobicyclo-[3.2.2]-non-2-ene-2,3-dioxide | 0.06 |
| (l) | Victoria Green (C.I. Pigment Green 18) | 0.03 |
| (m) | Methylene chloride | 215 |
| (n) | Methanol | 25 |

The mixture is coated on a 0.00127 cm thick polyethylene terephthalate web and dried to give a photopolymerizable layer with a dry thickness of 0.00254 cm.

The photosensitive layer is laminated to the clean anodized surface of a thin aluminum plate and self trimmed using the lamination procedure of Example I.

The laminated and trimmed board is imaged by exposing for sixty seconds the photosensitive layer through a halftone transparency to UV radiation from a Colight® DMVL-HP light source. The unexposed areas are completely removed by development for 30–40 seconds in an aqueous solution of sodium carbonate to provide a halftone polymeric image with complimentary image areas of bare aluminum surface. The resulting lithographic printing plate is conventionally gummed, inked and used to produce numerous printed copies.

EXAMPLE VI

Preparation of a Lithographic Printing Plate

A photosensitive coating mixture was prepared and coated as in Example I except that instead of the beads used therein, 16 parts by weight of 1 micron polyethylene beads (Microfine VIII—F. Gold, tradename of Dura Commodities Corporation, Harrison, NY) were dispersed in the coating solution. The surface of a 0.023 cm thick aluminum plate was scrubbed with tungsten carbide brushes in water using a Chemcut® Model 107 (tradename of Chemcut Corporation, State College, PA) Mechanical Cleaning System and the scrubbed surface was laminated to the photosensitive layer and the layer trimmed as described in Example I.

The laminated and trimmed board was imaged by exposing for 60 seconds the photosensitive layer through a halftone and line transparency to U.V. radiation from a 2000 watt pulsed Xenon arc light source in a flip top platemaker. The unexposed areas were completely removed by development for 30-40 seconds in a 1% aqueous solution of sodium carbonate to provide a halftone polymeric image with complimentary image areas of bare aluminum surface. The resulting lithographic printing plate was conventionally gummed with Lydex ® Finishing Solution (LDFS) (tradename of E. I. du Pont de Nemours and Company, Wilmington, DE) and mounted on an A. B. Dick Model 380 offset printing press. Using standard inking and fountain solutions, at least 3500 copies of good quality were obtained from the printing plate.

It is noteworthy from the data in the foregoing examples that each of the photosensitive layers containing the amphoteric interpolymer exhibited good photopolymerization rate, as shown by the short exposure times, as well as good development rate, as shown by the short times needed for development.

We claim:

1. A photosensitive composition having reduced cold flow comprising (a) addition polymerizable ethylenically unsaturated monomer; (b) an initiating system activatable by actinic radiation; and (c) an organic polymeric binder containing at least two percent by weight of an amphoteric polymer which, is an interpolymer of (1) 30-60 percent by weight of a comonomer selected from the group consisting of $C_{2-12}$ N-alkyl acrylamide and $C_{2-12}$ N-alkyl methacrylamide, $C_{1-4}$ alkyl ($C_{2-4}$) aminoalkyl acrylates and $C_{1-4}$ alkyl ($C_{2-4}$) aminoalkyl methmethacrylates, and mixtures thereof; (2) 10-25 percent by weight of an acidic comonomer selected from the group consisting of acrylic, methacrylic, crotonic, itaconic, maleic and fumaric acids and $C_{1-4}$ alkyl half esters of maleic and fumaric acid, and mixtures thereof; and (3) 20-55 percent of a copolymerizable comonomer selected from the group consisting of $C_1-C_{12}$ alkyl acrylates, $C_1-C_{12}$ alkyl methacrylates, $C_{2-4}$ hydroxyalkyl acrylates, hydroxystearyl acrylate, hydroxyalkyl methacrylates, hydroxystearyl methacrylates and mixtures thereof.

2. The photosensitive composition of claim 1 in which the interpolymer is the sole polymeric constituent of the binder.

3. The photosensitive layer of claim 1 in which the interpolymer is prepared from a monomer mix containing 40 parts by weight tertiary-octyl acrylamide, 15 parts by weight acrylic acid, 35 parts by weight methyl methacrylate, 5 parts by weight hydroxypropyl acrylate, and 5 parts by weight of tertiary-butyl aminoethyl methacrylate.

4. A photoresist element comprising a thin layer of photosensitive composition coated upon a strippable support, the photosensitive composition having reduced cold flow and comprising (a) addition polymerizable ethylenically unsaturated monomer; (b) an initiating system activatable by actinic radiation; and (c) an organic polymeric binder containing at least two percent by weight of an amphoteric polymer which is an interpolymer of (1) 30-60 percent by weight of a comonomer selected from the group consisting of $C_{2-12}$ N-alkyl acrylamide and $C_{2-12}$ N-alkyl methacrylamide, $C_{1-4}$ alkyl ($C_{2-4}$) aminoalkyl acrylates and $C_{1-4}$ alkyl ($C_{2-4}$) aminoalkyl methacrylates, and mixtures thereof; (2) 10-25 percent by weight of an acidic comonomer selected from the group consisting of acrylic, methacrylic, crotonic, itaconic, maleic and fumaric acids and $C_{1-4}$ alkyl half esters of maleic and fumaric acid, and mixtures thereof; and (3) 20-55 percent of a copolymerizable comonomer selected from the group consisting of $C_1-C_{12}$ alkyl acrylates $C_1-C_{12}$ alkyl methacrylates, $C_{2-4}$ hydroxyalkyl acrylates, hydroxystearyl acrylate, hydroxyalkyl methacrylates, hydroxystearyl methacrylates, and mixtures thereof.

5. The element of claim 4 in which the interpolymer is the sole polymeric constituent of the binder.

6. The element of claim 4 in which the interpolymer is prepared from a monomer mix containing on a weight basis 40% t-octyl acrylyamide, 15% acrylic acid, 35% methyl methacrylate, 5% hydroxypropyl acrylate, and 5% t-butyl aminoethyl methacrylate.

7. The element of claim 4 having a protective cover sheet.

8. A photoresist element in roll form comprising a thin layer of photosensitive composition coated upon a strippable support, the roll being formed with the support outermost, the photosensitive composition having reduced cold flow and comprising (a) addition polymerizable ethylenically unsaturated monomer; (b) an initiating system activatable by actinic radiation; and (c) an organic polymeric binder containing at least two percent by weight of an amphoteric polymer which is an interpolymer of (1) 30-60 percent by weight of a comonomer selected from the group consisting of $C_{2-12}$ N-alkyl acrylamide and $C_{2-12}$ N-alkyl methacrylamide, $C_{1-4}$ alkyl ($C_{2-4}$) aminoalkyl acrylates and $C_{1-4}$ alkyl ($C_{2-4}$) aminoalkyl methacrylates, and mixtures thereof; (2) 10-25 percent by weight of an acidic comonomer selected from the group consisting of acrylic, methacrylic, crotonic, itaconic, maleic and fumaric acids and $C_{1-4}$ alkyl half esters of maleic and fumaric acid, and mixtures thereof; and (3) 20-55 percent of a copolymerizable comonomer selected from the group consisting of $C_1-C_{12}$ alkyl acrylates, $C_1-C_{12}$ alkyl methacrylates, $C_{2-4}$ hydroxyalkyl acrylates, hydroxystearyl acrylate, hydroxyalkyl methacrylates, hydroxystearyl methacrylates and mixtures thereof.

9. The photoresist element of claim 8 having a thin layer of release material coated the reverse side of the strippable support.

10. The photoresist element of claim 8 having a protective cover sheet.

11. The photopolymerizable layer of claim 1 in which the interpolymer is prepared from a monomer mix containing by weight 35-45 percent N-tert.-octyl acrylamide, 12-18 percent acrylic acid, methacrylic acid or mixtures thereof, 32-38 percent methyl methacrylate, 2-10 percent hydroxypropyl acrylate and 2-10 percent $C_{1-4}$ alkyl $C_{2-4}$ aminoalkyl acrylate, methacrylate or mixtures thereof.

12. The photoresist element of claim 4 in which the interpolymer is prepared from a monomer mix containing by weight 35-45 percent N-tert.-octyl acrylamide, 12-18 percent acrylic acid, methacrylic acid or mixtures thereof, 32-38 percent methyl methacrylate, 2-10 percent hydroxypropyl acrylate and 2-10 percent $C_{1-4}$ alkyl $C_{2-4}$ aminoalkyl acrylates, methacrylate or mixtures thereof.

13. The roll form photoresist element of claim 8 in which the interpolymer is prepared from a monomer mix containing by weight 35-45 percent N-tert.-octyl acrylamide, 12-18 percent acrylic acid, methacrylic acid or mixtures thereof, 32-38 percent methyl methacrylate, 2-10 percent hydroxypropyl acrylate and 2-10 percent $C_{1-4}$ alkyl $C_{2-4}$ aminoalkyl acrylates, methacrylate or mixtures thereof.

* * * * *